United States Patent [19]
Iwata et al.

[11] Patent Number: 5,889,424
[45] Date of Patent: Mar. 30, 1999

[54] PULSE WIDTH MODULATION OPERATION CIRCUIT

[75] Inventors: Atsushi Iwata, Higashihiroshima; Makoto Nagata, Hiroshima, both of Japan

[73] Assignee: President of Hiroshima University, Higashihiroshima, Japan

[21] Appl. No.: 18,836

[22] Filed: Feb. 4, 1998

[30] Foreign Application Priority Data

Feb. 5, 1997 [JP] Japan .................................. 9-022805

[51] Int. Cl.⁶ ......................................................... G06G 7/12
[52] U.S. Cl. ........................ 327/355; 395/800.16; 706/35
[58] Field of Search ....................... 327/355; 395/800.16, 395/800.18; 706/35

[56] References Cited

U.S. PATENT DOCUMENTS 5,696,708  12/1997  Leung .................................. 364/724.1

*Primary Examiner*—Shawn Riley
*Attorney, Agent, or Firm*—Oblon, Spivak, McClelland, Maier & Neustadt, P.C.

[57] ABSTRACT

The invention provides a pulse width modulation operation circuit for processing an m-bit pulse width modulation signal which is represented by a number n of sub pulse width modulation signals, where n is a divisor of m, characterized by comprising at least two equivalent pulse modulation operation circuits for individually processing the number n of sub pulse width modulation signals and outputting the processing results in the form of binary digital signals, and means for adding the binary digital signals from the pulse modulation operation circuits. The pulse modulation operation circuits include current pulse generating means for generating current pulses corresponding to the sub pulse width modulation signals, a current bus for transmitting the generated current pulses, and means for integrating the current pulses and converting the integrated current pulses into charges, and means for digitizing the sum of the charges to obtain digitized data. Alternatively, the pulse width modulation operation circuit comprises at least one pulse modulation operation circuit for processing the number n of sub pulse width modulation signals in a time-series manner and outputting the processing results in the form of binary digital signals.

3 Claims, 3 Drawing Sheets

PULSE WIDTH MODULATION OPERATION CIRCUIT

BACKGROUND OF THE INVENTION

This invention relates to the microelectronics field in which high-speed, high-accuracy parallel operations are performed in a time-series manner, using pulse modulation signals, to realize intelligent processing equivalent to the human brain.

With the development of microelectronics, an apparatus has been realized, which can process a great amount of information, i.e. can perform intelligent processing or image signal processing. In such an apparatus, multi-bit numeric value information is processed using, in general, binary digital signals. Since, however, the energy consumed in a digital circuit is proportional to the number of pulses used therein, high energy is required for one operation if multi-bit numeric value information is represented by a plurality of pulses. Further, since the signal processing is performed on a sequential basis, a large-scale circuit is required to process a plurality of signals in a parallel manner. To avoid this, processing of multi-bit numeric information using a PWM (Pulse Width Modulation) signal in place of a binary digital signal is now proposed.

The PWM signal has a voltage amplitude which can be represented by a digital value, and a pulse width which indicates analog information. With the development of the microelectronics techniques, a MOS transistor, which is a basic structural element of an integrated circuit capable of processing the PWM signal, has been refined. As a result, a CMOS circuit capable of processing a pulse width at a time resolution of 1 ns has been realized. Parallel sum-of-product calculation which is considered basic intelligent processing can be made efficient, using the PWM signal in a very large-scale, high-speed integrated circuit such as the CMOS circuit.

An arithmetic operation of each pulse of a PWM signal, which indicates multi-bit numeric information, requires a period of time substantially equal to its pulse width. Supposing, for example, that the time resolution is 1 ns in the case of 16 bits, the time required for processing a maximum pulse width indicative of 16 bits is $2^{16}$ ns, i.e. about 70 $\mu$s, which is longer by thousand times than the time required for processing a usual digital signal. This being so, it is indispensable to increase the operation accuracy and speed of the multi-bit PWM signal operation circuit.

BRIEF SUMMARY OF THE INVENTION

The present invention has been developed under the above-described circumstances, and aims to provide an arithmetic operation circuit capable of performing, using a PWM signal, very large-scale parallel operation of a larger number of bits at a higher speed than ever, thereby realizing intelligent processing equivalent to the processing of the human brain.

To attain the object, there is provided a pulse width modulation operation circuit for processing an m-bit pulse width modulation signal which is represented by a number n of sub pulse width modulation signals, where n is a divisor of m, characterized by comprising: at least two equivalent pulse modulation operation circuits for individually processing the number n of sub pulse width modulation signals and outputting the processing results in the form of binary digital signals; and means for adding the binary digital signals from the pulse modulation operation circuits.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The invention processes a PWM signal containing multi-bit information by dividing the PWM signal into a plurality of sub PWM signals to thereby compress its pulse width.

Figure 1:
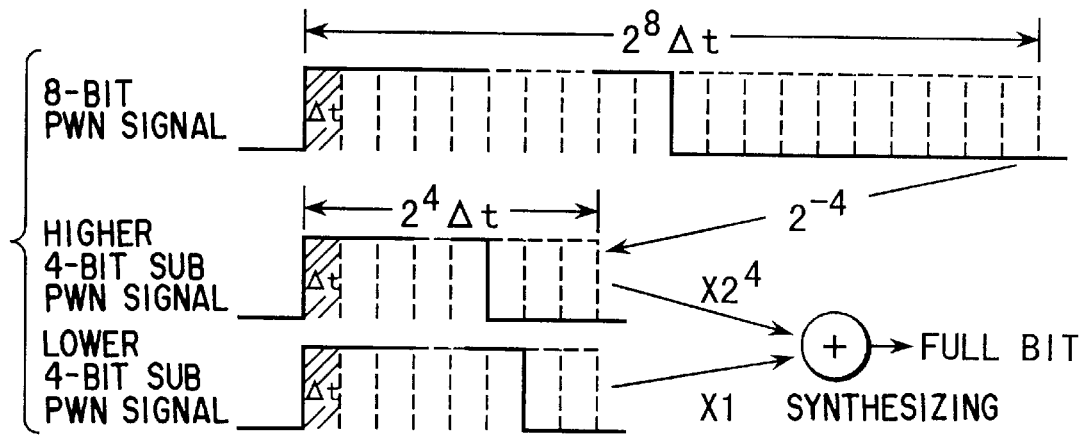
FIG. 1 is a view, useful in explaining how to represent a multi-bit PMW signal and a sub PMW signal.

For example, the case of dividing an 8-bit PWM signal into two 4-bit PWM signals will be described. As is shown in FIG. 1, sub PWM signals are prepared which correspond to higher four bits and lower four bits of 8-bit information carried by the PWM signal, respectively. The sub PWM signals are processed by independent 4-bit PWM signal operation circuits and then synthesized.

The maximum time required for operating an 8-bit PWM signal is $2^8\Delta t$, while the maximum time required for operating a 4-bit PWM signal is $2^4\Delta t$ ($\Delta t$ represents a maximum operation time for each bit). Since $2^8\Delta t:2^4\Delta t=16:1$, the maximum time required for processing information represented by two 4-bit PWM signals can be reduced to about $\frac{1}{16}$ of the maximum time required for processing the information represented by a single 8-bit PWM signal.

Thereafter, the operation result is weighted by a digital circuit to thereby obtain an accurate 8-bit operation result. Since in this case, the required circuit scale is, at maximum, three times the 8-bit operation circuit even if it includes the digital circuit, the ratio of the operation performance to the required area of the overall circuit can be greatly increased. The specific embodiments of the invention will be described with reference to the accompanying drawings.

[First Embodiment]

Figure 2:
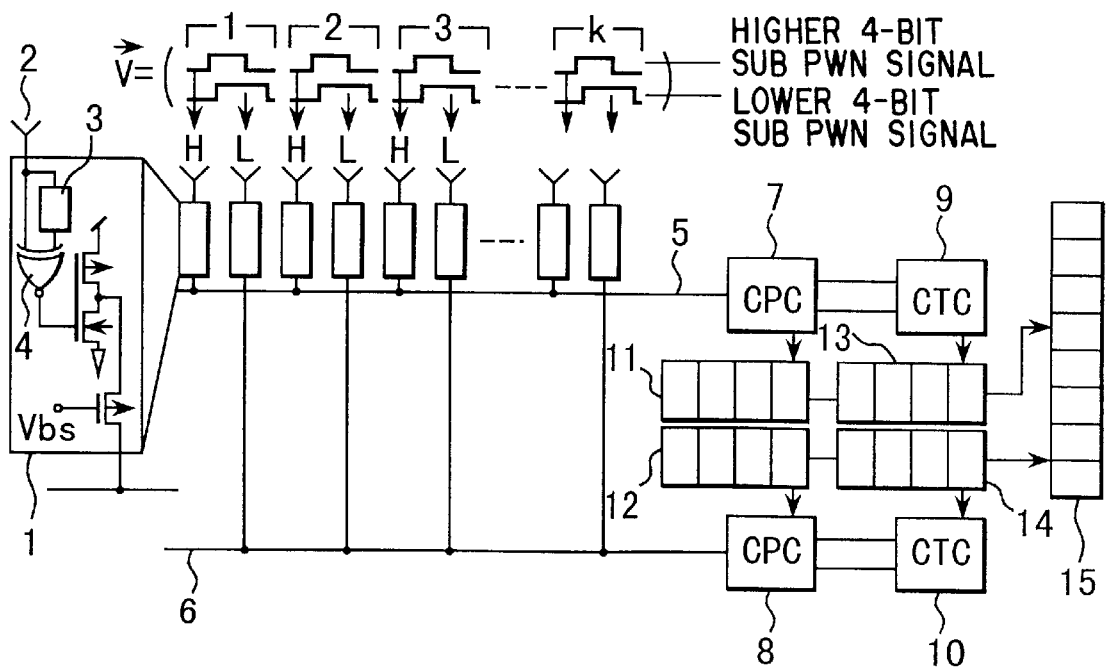
FIG. 2 is a view, showing a PWM signal distance calculation circuit according to an embodiment of the invention.

FIG. 2 shows a PWM signal distance calculation circuit employed in the invention. In this embodiment, a Manhattan distance is obtained by calculating the sum of the absolute difference between corresponding components of k-dimensional PWM signal vector pairs which each consist of an input vector and a reference vector. Each component of a number k of PWM signal vectors is represented by an 8-bit PWM signal which consists of two 4-bit sub PWM signals indicative of higher 4-bit information and lower 4-bit information, respectively. The distance calculation result is represented by a binary digital signal. The structure and operation of the above-described circuit will now be described.

The FIG. 2 circuit performs, for distance calculation, addition of k-dimensional 8-bit PWM signals each consisting of an input vector and a reference vector. In FIG. 2, a number k of 8-bit PWM signals consist of a number k of higher 4-bit sub PWM signals and a number k of lower 4-bit sub PWM signals (indicated by H and L, respectively). To divide an 8-bit PWM signal into two 4-bit sub PWM signals, divider means (not shown) used in general signal processing can be used. Each sub PWM signal is input to a corresponding switch current source 1 via a corresponding input terminal 2.

To perform distance calculation, the reference vector and the input vector, which constitute sub PWM signals, are input to each switch current source 1 via a corresponding input terminal 2. All reference vectors are once stored in a PWM signal memory circuit 3. A sub PWM signal indicative of the input vector input to the source 1 and a sub PWM signal pulse indicative of the reference vector read from the PWM signal memory 3 are simultaneously input to an exclusive OR circuit 4, thereby forming a PWM signal which has a pulse width corresponding to the absolute difference therebetween. This PWM signal operates the switch current source to generate a constant current for a period of time corresponding to the pulse width. Thus, a current pulse is generated.

The outputs of a number k of switch current sources for receiving higher 4-bit sub PWM signals are connected to a common current bus 5. Similarly, the outputs of a number k of switch current sources for receiving lower 4-bit sub PWM signals are connected to a common current bus 6. Current pulses generated from the k switch current sources for receiving the higher 4-bit sub PWM signals are added together on the common current bus 5, while current pulses generated from the k switch current sources for receiving the lower 4-bit sub PWM signals are added together on the common current bus 6.

Figure 4:
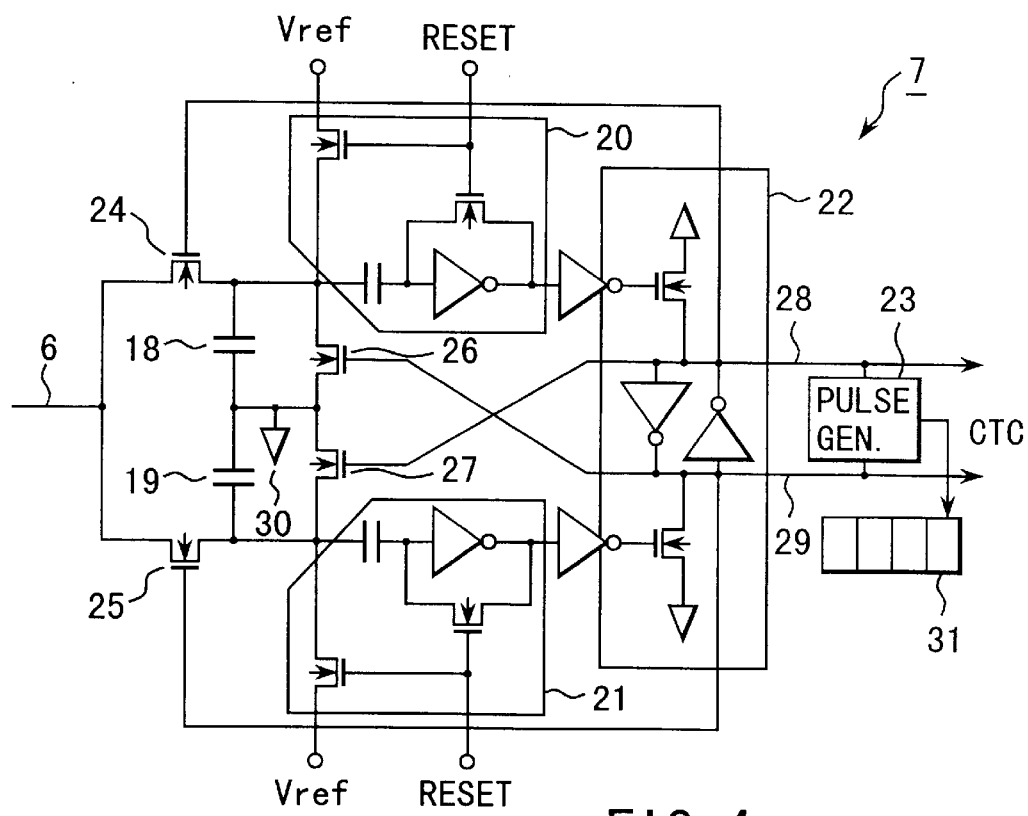
FIG. 4 is a circuit diagram, showing a reference charge counter circuit (CPC) incorporated in the circuit of FIG. 2.

The added current pulses are converted, by integrating on a capacitance, into a total charge $Q_{total}$ which is proportional to the total pulse width of the current pulses, using reference charge counter circuits 7 and 8. Each of the counter circuits 7 and 8 therefore has a function for integration and a function for digitizing the total charge $Q_{total}$ in real time in units of a reference charge. The counter circuits 7 and 8, which correspond to the higher 4-bit sub PWM signals and the lower 4-bit sub PWM signals, respectively, are equivalent to each other, and have a structure as shown in FIG. 4.

Figure 5:
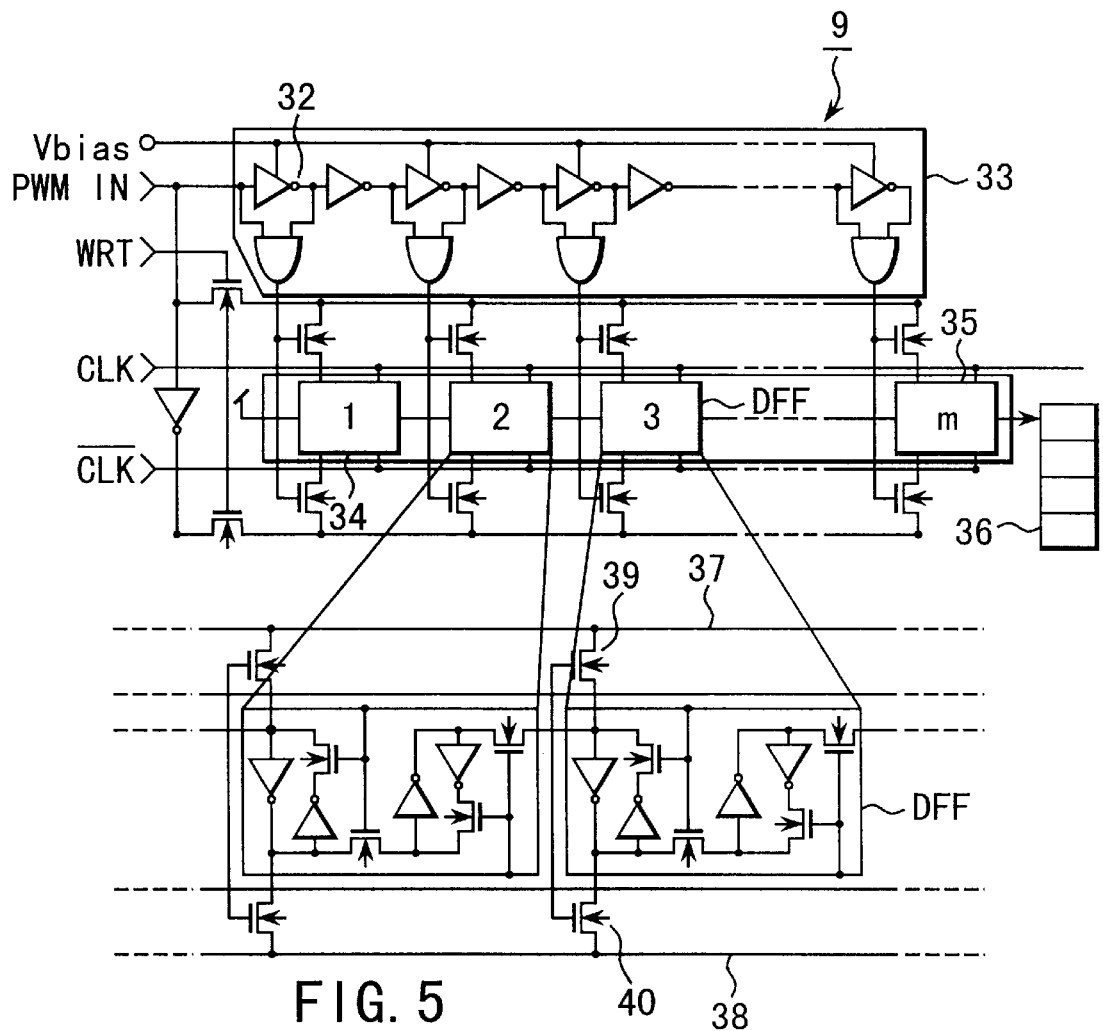
FIG. 5 is a circuit diagram, showing a charge-time converter circuit (CTC) incorporated in the circuit of FIG. 2.

Further, extra charges, which will occur as quatization errors in the reference charge counter circuits 7 and 8, are digitized in a time-series manner by charge-time converter circuits 9 and 10, respectively, thereby improving the time resolution of calculation. The charge-time converter circuits 9 and 10, which correspond to the higher and lower 4-bit sub PWM signals, respectively, are equivalent to each other, and have a structure as shown in FIG. 5.

The digitized values are added together by digital counter circuits 11–14, and output in the form of binary digital signals as addition results of PWM signals. The digital counter circuits 11 and 12, which correspond to the higher 4-bit sub PWM signals and the lower 4-bit sub PWM signals, respectively, are equivalent to each other. Further, the digital counter circuits 13 and 14 are also equivalent to each other. Subsequently, the digital counter circuit 15 shifts the calculation results of the higher 4-bit sub PWM signals by 4 bits in the MSB direction, and adds them to the calculation results of the lower 4-bit sub PWM signals, thereby obtaining a distance calculation value.

Figure 3:
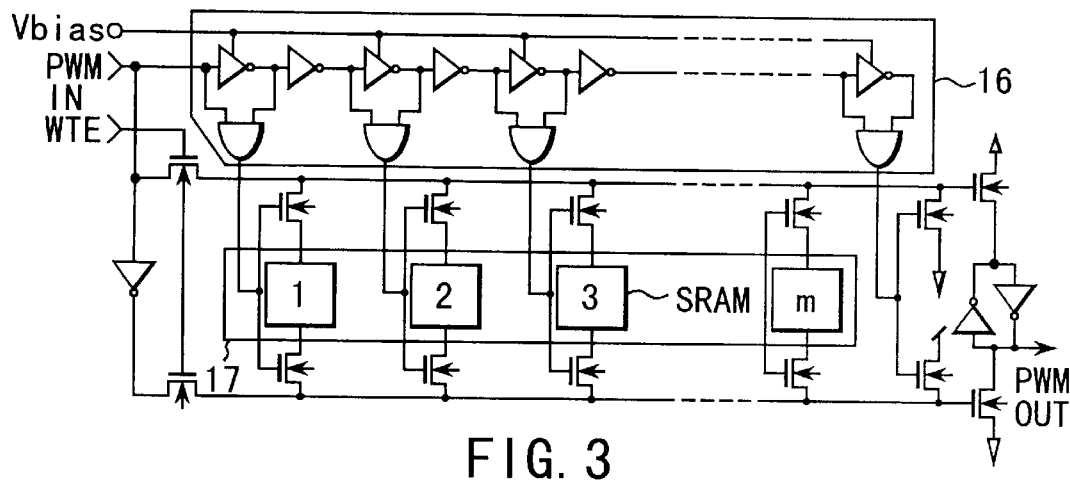
FIG. 3 is a circuit diagram, showing a PWM signal memory circuit incorporated in the circuit of FIG. 2.

FIG. 3 shows an example of a structure of the PWM signal memory circuit 3. As is shown in FIG. 3, the memory mainly comprises a multi-phase clock generation circuit 16 and an SRAM circuit array 17. A multi-phase clock generated by the circuit 16 sequentially addresses SRAMs 1 - m incorporated in the SRAM circuit array 17. During writing, the input PWM signal is digitized using the delay time D and written into the SRAM circuit array 17 in the form of succession of "1"s. During reading, on the other hand, successive "1"s stored in the SRAM circuit array 17 are read in units of the delay time D to thereby reproduce the PWM signal. These operations are performed by activating the multi-phase clock circuit using the PWM signal, and hence performed out of synchronism with one another.

FIG. 4 shows an example of a structure of the reference charge counter circuit 7 (or 8). The reference charge counter circuit digitizes current pulses added by the common current bus 5 (or 6). Specifically, the circuit 7 (or 8) mainly comprises two integrating capacitors 18 and 19, two chopper type voltage comparator circuits 20 and 21 for comparing the integrated voltages of the capacitors with an external reference voltage $V_{ref}$, a latch circuit 22 for controlling the integration and discharge operations of the integrating capacitors 18 and 19, and a pulse generating circuit 23 for generating a short pulse each time the state of the latch circuit varies.

The two integrating capacitors 18 and 19 have the same capacitance. The other end of the integrating capacitor 18 which is not connected to the capacitor 19 is connected to a switch 24 for connecting and disconnecting the capacitor to and from the common current bus, and also to a switch 26 for discharge connected to a grounded terminal 30. Similarly, the other end of the integrating capacitor 19 is connected to a switch 25 for connecting or disconnecting the capacitor to and from the common current bus, and also to a switch 27 for discharge connected to the grounded terminal 30. The junction between the capacitors 18 and 19 is grounded. These switches are each connected to the output terminals 28 and 29 of the latch circuit 22 which are inverse in phase to each other, so that the integrating capacitors 18 and 19 will operate in opposite phases. Accordingly, while one of the capacitors integrates current pulses on the current bus, the other is controlled to perform discharge. When the integrated voltage of the integrating capacitor which is now connected to the common current bus 6 and is now executing integration becomes equal to the external reference voltage $V_{ref}$, the output of a corresponding one of the voltage comparator circuits 20 and 21 located at a later stage will be inverted, thereby changing the state of the latch circuit 22 and changing the capacitor connected to the common current bus 6 between the capacitors 18 and 19. Simultaneously, the pulse generating circuit 23 generates a short pulse, which is counted by an asynchronous counter circuit 31 located after the circuit 15. The counter circuit 31 corresponds to the digital counter circuits 11 and 12 of FIG. 2.

Although this embodiment employs the reference charge counter circuit 7 shown in FIG. 4 and including the two integrating capacitors 18 and 19, the embodiment is not limited to the circuit 7 but may be modified such that only a single integrating capacitor is used to realize the same function.

Where the capacitance of each of the integrating capacitors 18 and 19 is $C_{int}$ and the external reference voltage is $V_{ref}$, the total charge $Q_{total}$ is digitized in units of $Q_{std}=C_{int}V_{ref}$. Supposing that the digitized value is A, $Q_{total}=AQ_{std}+Q_r$ is satisfied where $Q_r$ ($<Q_{std}$) represents the quantization error.

FIG. 5 shows an example of a structure of the charge-time conversion circuit 9 (or 10). As is shown in FIG. 5, the charge-time converter circuit 9 comprises a multi-phase clock generating circuit 33 consisting of a number m of delay circuits 32 connected in series, and a register circuit 35 consisting of a number m of DFF circuits 34 connected in series and corresponding to the delay circuits 32. Each delay circuit 32 generates a single pulse of a width not longer than its delay time when the aforementioned short output pulse rises. As a result, a number m of independent sequential pulse trains are generated from the multi-phase clock generating circuit 33. When each of the delay circuits 32 corresponding to the DFF circuits 34 generates a pulse, a gate transistor 39 or 40 for connecting one of the outputs of the latch circuit to a differential bit line 37 or 38 is turned on, thereby writing the state of the differential bit line into the register circuit 35. Thus, the state of the differential bit line is stored in the register circuit by the multi-phase clock generating circuit 33 in units of the delay time D, and stored contents are sequentially read in synchronism with external clocks.

The differential bit lines 37 and 38 of each of the charge-time converter circuits 9 and 10 of FIG. 5 are connected to the latch circuit 22 of the reference charge counter circuit 7 of FIG. 4. After the digitized value A of the total charge $Q_{total}$ is obtained, the switch current source 1 to be referred to and the multi-phase clock generating circuit 33 are simultaneously turned on, thereby additionally integrating a reference current $I_{ref}$ and storing the state of the differential bit line in the register circuit. The time period for the additional integration performed until the state of the latch circuit 22 changes is stored as a succession of alternate "1"s and "0"s in the register circuit, and the state of the circuit 22 after the change is stored after the succession of numbers. A synchronous counter circuit 36 located after the register circuit 35 counts outputs from the charge-time converter circuit 9 or 10 in synchronism with the reading clock, thereby obtaining, from the output terminal of the register circuit, a number B of outputs stored in the DFF circuits 34 as "1" and "0". The synchronous counter circuit 36 corresponds to the digital counter circuits 13 and 14 of FIG. 2.

Where the reference current satisfies $Q_{std}=sDI_{ref}$, B represents a value obtained by digitizing the integrated charge $Q_r$ in units of $DI_{ref}$. In this case, $Q_r=BDI_{ref}+Q'_r$ is established, and $Q'_r$ ($<DI_{ref}$) represents the quantization error of the charge-time conversion circuit 9 or 10.

From the digitized value A obtained from the reference charge counter circuit 7 and the digitized value B obtained from the charge-time converter circuit 9 or 10, it is determined that the addition result is $2^c$ A+B where $s=2^c$. The binary digital representation can be realized by connecting the asynchronous counter circuit 31 to the synchronous counter circuit 36, with lower significant bits of the circuit 31 set as c bits.

As described above, in the PWM signal distance calculation circuit of the first embodiment, k-dimensional 8-bit PWM signals are divided into a number k of higher 4-bit sub PWM signals and a number k of lower 4-bit sub PWM signals. Each sub PWM signal is input to a corresponding switch current source 1 of the distance calculation circuit via a corresponding input terminal 2. Those of the switch current sources 1 which receive higher 4-bit sub PWM signals and are indicated by "H" are connected to the current bus 5, while those of the switch current sources 1 which receive lower 4-bit sub PWM signals and are indicated by "L" are connected to the current bus 6. Current pulses output to the current buses 5 and 6 are alternately integrated by the two integrating capacitors 18 and 19 respectively connected to the buses. As aforementioned, the capacitors 18 and 19 are controlled by the latch circuit such that one of them integrates current pulses while the other discharges the current accumulated therein, and such that the operations of the capacitors are changed to each other when an integrated voltage corresponding to the integrated current pulses has reached the reference voltage. The number of occasions on which the state of the latch circuit 22 changes is counted by the asynchronous counter circuit 31 to obtain a digitized value of the total integrated charge. Moreover, the integrated charges, which remain in the integrating capacitors 18 and 19 and are considered as a quantization error, are converted, by additional integration of the reference current in the charge-time conversion circuit 9 or 10, into a time period required from the start of integration to the time when the voltage has reached the reference voltage. As a result, the operation resolution can be increased by ten times.

The thus individually operated higher and lower 4-bit sub PWM signals are added together by the digital counter circuit 15 located at the last stage. In this addition, the digital counter circuit 15 shifts the calculation results of the higher 4-bit sub PWM signals by 4 bits in the MSB direction, and adds them to the calculation results of the lower 4-bit sub PWM signals.

[Second Embodiment]

Figure 6:
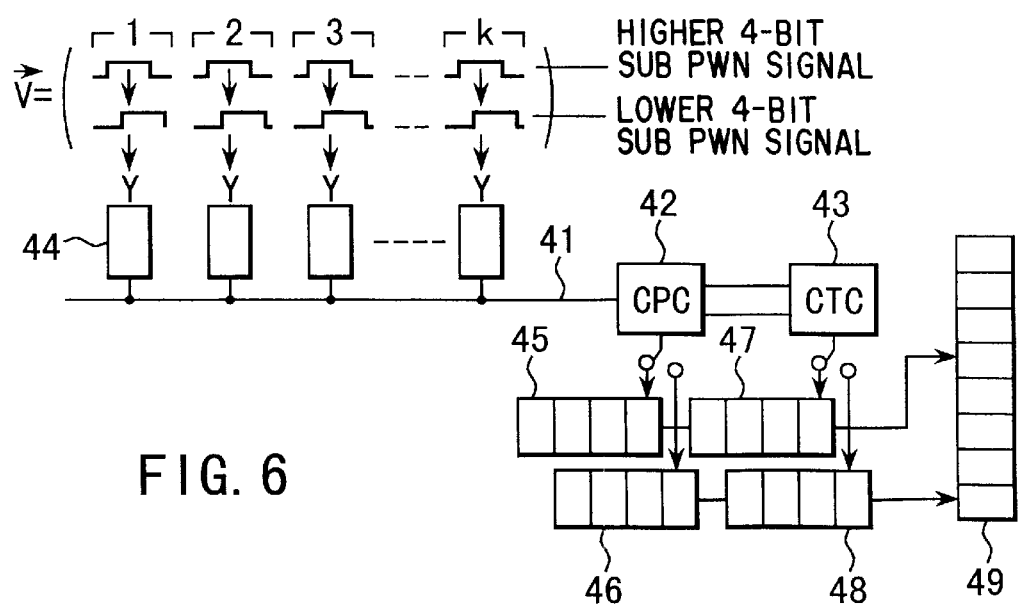
FIG. 6 is a view, showing another embodiment of the invention.

In the FIG. 2 embodiment, the higher and lower 4-bit sub PWM signals are processed in a parallel manner, respectively using the circuit 7, 9, 11, 13 and the circuit 8, 10, 12 and 14 which are independent of each other. The embodiment, however, can be modified as shown in FIG. 6, wherein calculation circuits 42, 43, etc. connected to a common current bus 41 can store, by time-series processing, the calculation results of the higher and lower bit signals in higher and lower bit registers incorporated therein. The time-series processing requires no particular circuit but can be performed by a usual electronic circuit and method. In a second embodiment, higher and lower 4-bit sub PWM signals are input to a single switch current source 44 in a time-series manner. Each switch current source 44 is connected to the common current bus 41. Each of a reference charge counter circuit 42 connected to the common current bus 41 and a charge-time conversion circuit 43 connected to the circuit 42 also processes the higher and lower 4-bit sub PWM signals in a time-series manner, thereby outputting the processed higher 4-bit sub PWM signals to digital counter circuits 45 and 47, and the processed lower bit sub PWM signals to digital counter circuits 46 and 48. The outputs of the counter circuits 47 and 48 are supplied to a digital counter circuit 49, where the calculation results of the higher 4-bit sub PWM signals are shifted by 4 bits in the MSB direction, and added to the calculation results of the lower 4-bit sub PWM signals, thereby obtaining a distance calculation value. The digital counter circuits 45 and 46 correspond to the digital counter circuits 11 and 12 in FIG. 2, the digital counter circuits 47 and 48 to the digital counter circuits 13 and 14 in FIG. 2, and the digital counter circuit 49 to the digital counter circuit 15 in FIG. 2.

Although the embodiments are each directed to a PWM signal distance calculation circuit which processes a number k of 8-bit PWM signals divided into a number k of higher an lower 4-bit sub PWM signals, it is a matter of course that the invention is not limited to the embodiments or to PWM signal distance calculation circuits.

As described above, the PWM operation circuit has the following advantages:

The maximum operation time required to process a pulse width can be reduced to $2^{-m(1-1/n)}$ by representing an m-bit PWM signal with a number n of sub PWM signals (where n is a divisor of m). Further, the sub PWM signals can be operated in a parallel manner by a pulse modulation circuit, and the m-bit-order accuracy of the operation results can be maintained by digitally synthesizing them.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A pulse width modulation operation circuit for processing an m-bit pulse width modulation signal which is represented by a number n of sub pulse width modulation signals, where n is a divisor of m, characterized by comprising:

at least two equivalent pulse modulation operation circuits for individually processing the number n of sub pulse width modulation signals and outputting the processing results in the form of binary digital signals; and means for adding the binary digital signals from the pulse modulation operation circuits.

2. The circuit according to claim 1, characterized in that:

the pulse modulation operation circuit includes current pulse generating means for generating current pulses corresponding to the sub pulse width modulation signals; a current bus for transmitting the generated current pulses; and means for integrating the current pulses and converting the integrated current pulses into charges; and means for digitizing the sum of the charges to obtain digitized data.

3. A pulse width modulation operation circuit for processing an m-bit pulse width modulation signal which is represented by a number n of sub pulse width modulation signals, where n is a common divisor of m, characterized by comprising:

at least one pulse modulation operation circuit for processing the number n of sub pulse width modulation signals in a time-series manner and outputting the processing results in the form of binary digital signals; and means for adding the binary digital signals from the pulse modulation operation circuit.

* * * * *